United States Patent
Shin et al.

(10) Patent No.: US 9,584,145 B1
(45) Date of Patent: Feb. 28, 2017

(54) CIRCUIT FOR AND METHOD OF COMPENSATING FOR MISMATCH IN A TIME-INTERLEAVED ANALOG-TO-DIGITAL CONVERTER

(71) Applicant: Xilinx, Inc., San Jose, CA (US)

(72) Inventors: Jaewook Shin, San Jose, CA (US); Hiva Hedayati, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/133,798

(22) Filed: Apr. 20, 2016

(51) Int. Cl.
| | |
|---|---|
| *H03M 1/06* | (2006.01) |
| *H03M 1/12* | (2006.01) |
| *H03M 1/00* | (2006.01) |

(52) U.S. Cl.
CPC ........... *H03M 1/06* (2013.01); *H03M 1/1215* (2013.01); *H03M 1/00* (2013.01); *H03M 1/12* (2013.01); *H03M 1/1225* (2013.01)

(58) Field of Classification Search
CPC ......... H03M 1/00; H03M 1/12; H03M 1/1225
USPC .................. 341/118, 120, 122, 155, 141
See application file for complete search history.

(56) References Cited

U.S. PATENT DOCUMENTS

| | | | |
|---|---|---|---|
| 7,916,050 B1 | 3/2011 | Mujica et al. | |
| 8,830,094 B1 | 9/2014 | Erdmann | |
| 8,890,739 B2 | 11/2014 | Lewis et al. | |
| 8,917,125 B1 | 12/2014 | Waltari | |
| RE45,343 E | * 1/2015 | Kidambi | H03M 1/0624 341/118 |
| 9,030,340 B1 | * 5/2015 | Waltari | H03M 1/1245 341/118 |
| 2011/0260898 A1 | 10/2011 | Velazquez | |
| 2012/0075129 A1 | 3/2012 | Kidambi | |

OTHER PUBLICATIONS

Duan, Yida et al., "A 12.8 GS/s Time-Interleaved ADC with 25 GHz Effective Resolution Bandwidth and 4.6 ENOB," IEEE Journal of Solid-State Circuits, Aug. 2014, pp. 1725-1738, vol. 49, No. 8, IEEE, Piscataway, New Jersey, USA.
Huang, Chun-Cheng et al., "A CMOS 6-Bit 16-GS/s Time-Interleaved ADC Using Digital Background Calibration Techniques," IEEE Journal of Solid-State Circuits, Apr. 2011, pp. 848-858, vol. 46, No. 4, IEEE, Piscataway, New Jersey, USA.

* cited by examiner

*Primary Examiner* — Joseph Lauture
(74) *Attorney, Agent, or Firm* — John J. King

(57) ABSTRACT

A circuit for compensating for mismatch in a plurality of channels of a time-interleaved analog-to-digital converter is described. The circuit comprises an analog-to-digital converter circuit of a first channel of the plurality of channels configured to receive an analog input signal and to generate a digital value associated with the analog input signal; an arithmetic circuit configured to receive the digital value generated at the output of the analog-to-digital converter; a memory element configured to receive an output of the arithmetic circuit; and an accumulator circuit coupled to the memory element, wherein the accumulator generates an average value that is provided to the arithmetic circuit to modify the digital value generated at the output of the analog-to-digital converter while receiving the analog input signal.

20 Claims, 14 Drawing Sheets

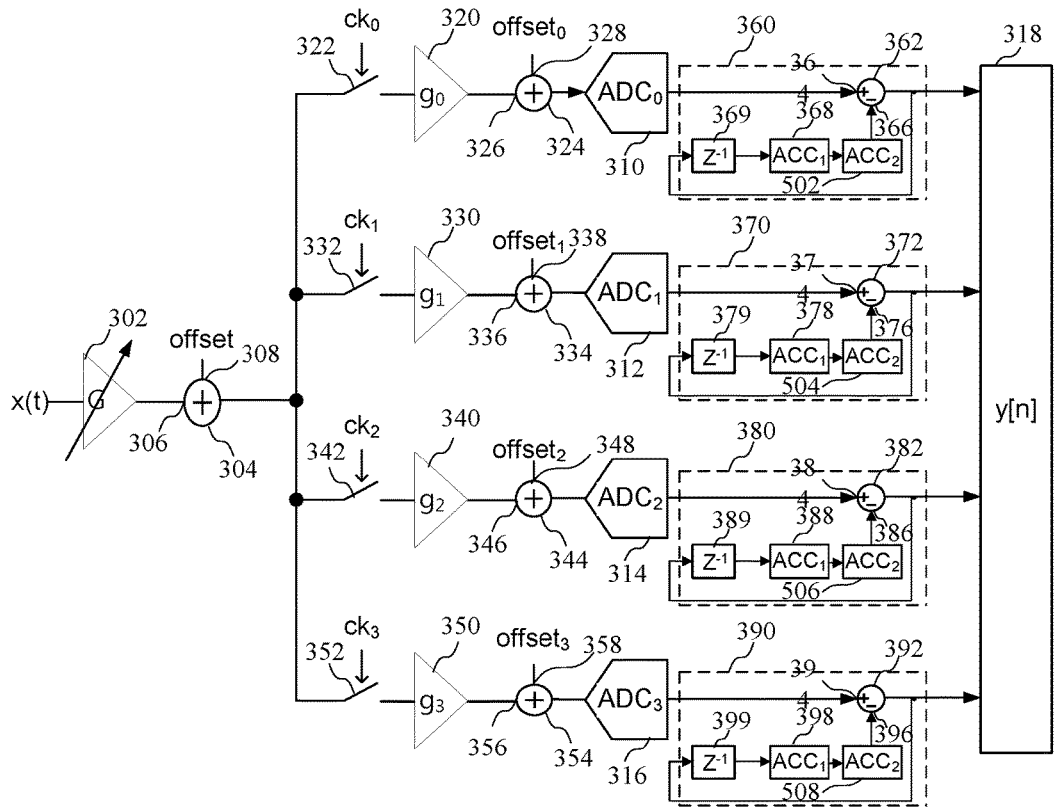
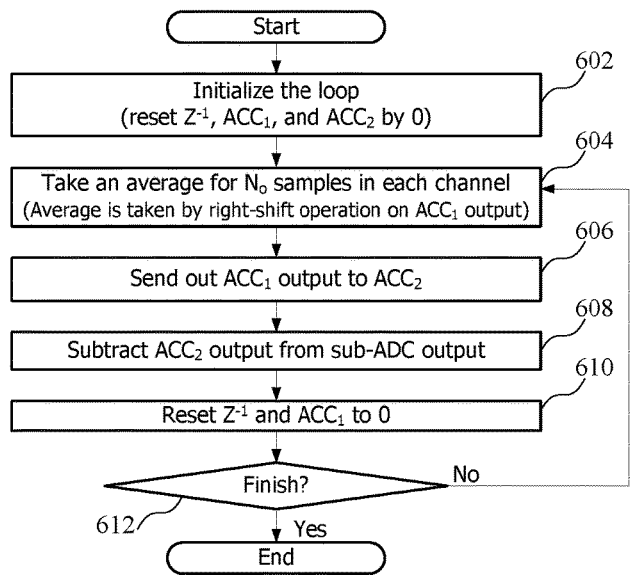
FIG. 5
FIG. 6

CIRCUIT FOR AND METHOD OF COMPENSATING FOR MISMATCH IN A TIME-INTERLEAVED ANALOG-TO-DIGITAL CONVERTER

TECHNICAL FIELD

The present invention relates generally to integrated circuit devices, and in particular, to a circuit for and a method of compensating for mismatch in a time-interleaved analog-to-digital converter.

BACKGROUND

Data transmission is an important function in many integrated circuit devices. Efforts are continuously being made to increase the data rate of data transmitted by an integrated circuit. However, it is important to accurately transmit the data at the increased data rate. As bandwidth requirements of wire-line and wireless transceiver systems becomes stringent, a multi-step sampling time-interleaved (TI) analog-to-digital converter (ADC) has become a more desirable solution. Time-interleaved ADCs can achieve wide bandwidth data conversion by interleaving multiple channels that includes sub-ADCs.

However, time interleaved analog-to-digital converters are prone to mismatch between channels. More particularly, mismatch in offset voltage, gain, clock timing skew, and bandwidth between the individual channels may degrade the operation of the TI-ADC. Conventional circuits that compensate for mismatch in the multiple channels require significant hardware. Such circuits are not suitable for high speed operation, such as data transfer rates of 56 gigabits per second (Gb/s). Further, many of the conventional circuits provide foreground calibration, and therefore only provide offline calibration.

Accordingly, circuits and methods that minimize mismatch in offset voltage, gain and timing skew in an analog-to-digital converter are beneficial.

SUMMARY

A circuit for compensating for mismatch in a plurality of channels of a time-interleaved analog-to-digital converter is described, where each channel of the plurality of channels comprises an analog-to-digital converter circuit configured to receive an analog input signal and to generate a digital value associated with the analog input signal; a subtractor circuit configured to receive the digital value generated at an output of the analog-to-digital converter; a memory element configured to receive an output of the subtractor circuit; and an accumulator circuit coupled to the memory element, wherein the accumulator circuit generates an average value representing an offset voltage that is subtracted from the digital value generated at the output of the analog-to-digital converter by the subtractor circuit.

Another circuit for compensating for mismatch in a plurality of channels of a time-interleaved analog-to-digital converter is described, where each channel of the plurality of channels comprises an analog-to-digital converter circuit configured to receive an analog input signal and to generate a digital value associated with the analog input signal; a multiplier circuit configured to receive the digital value generated by the analog-to-digital converter; a memory element configured to receive an output of the multiplier circuit; and an accumulator circuit coupled to the memory element, wherein the multiplier circuit enables controlling a gain of the digital signal generated at the output of the analog-to-digital converter using a gain control signal based upon an output of the accumulator circuit and a reference gain.

A further circuit for compensating for mismatch in a plurality of channels of a time-interleaved analog-to-digital converter is also described, where each channel of the plurality of channels comprises an analog-to-digital converter circuit configured to receive an analog input signal and to generate a digital value associated with the analog input signal; a memory element configured to receive the digital value generated at an output of the analog-to-digital converter circuit; an accumulator circuit coupled to the memory element, wherein the accumulator circuit generates an average value representing a skew value that is used to generate a reference skew value; and a skew control circuit configured to receive an output of the accumulator circuit and the reference skew signal to compensate for skew of the channel with respect to a reference channel.

Other features will be recognized from consideration of the Detailed Description and the Claims, which follow.

BRIEF DESCRIPTION OF THE DRAWINGS

FIG. 5 is a block diagram of another circuit for zeroing offsets including determining a residual offset in an analog-to-digital converter;

FIG. 6 is a flow chart showing a method of implementing the circuit of FIG. 5;

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below extract and compensate for mismatch in the digital domain in the background (i.e. while receiving data) without interrupting the input signal. The circuits and methods also enable implementing a TI ADC without any reference ADC and reduce hardware requirements compared to conventional devices. For example, unlike conventional TI ADC implementations that use multipliers, the circuits of the present invention use adders for gain and skew mismatch extraction. The circuits provide improved hardware efficiency and performance by providing a control loop at the output of each ADCs of the plurality of ADC circuits. Each control loop generates an average value (i.e. mismatch compensation variable) that is used to modify the digital value generated at the output of the ADC while receiving the analog input signal. More particularly, the circuits comprise an arithmetic circuit (for mismatch compensation) configured to receive the digital value generated at the output of the analog-to-digital converter, a memory element configured to receive an output of the arithmetic circuit, and an accumulator circuit coupled to the memory element. The accumulator generates an average value that is provided to the arithmetic circuit to modify the digital value generated at the output of the analog-to-digital converter while receiving the analog input signal.

Figure 1:
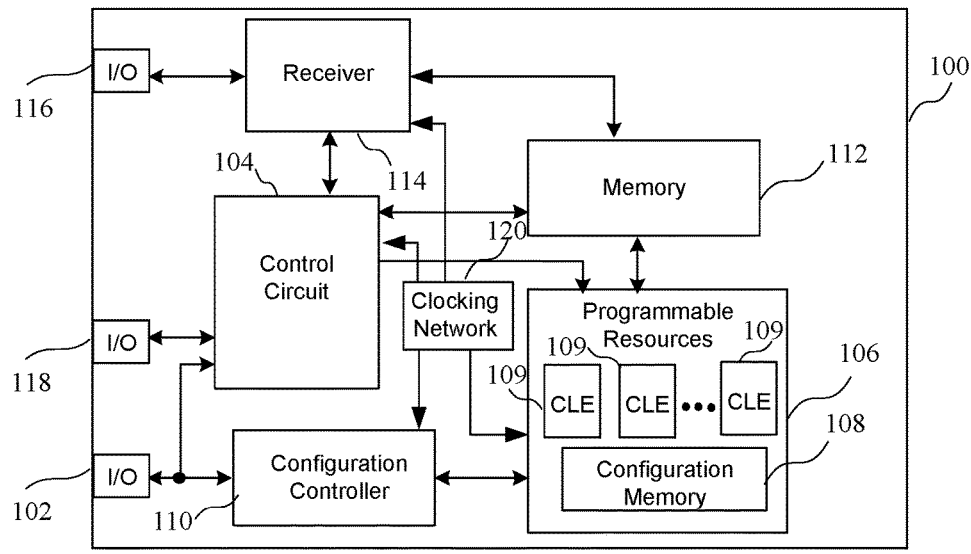
FIG. 1 is a block diagram of an integrated circuit 100 comprising a receiver circuit for implementing time-interleaved analog-to-digital converter circuits.

Turning first to FIG. 1, a block diagram of an integrated circuit 100 comprising a receiver a receiver circuit for implementing time-interleaved analog-to-digital converter circuits as described in FIGS. 2-20 is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. A memory 112 may be coupled to the control circuit 104 and the programmable resources 106. A receiver circuit 114 may be coupled to the control circuit 104, programmable resources 106 and the memory 112, and may receive signals at the integrated circuit by way of I/O port 116. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods described in more detail below may be compensating for mismatch in a time-interleaved ADC converter of the circuit of FIG. 1, and particularly the receiver circuit 114.

Figure 2:
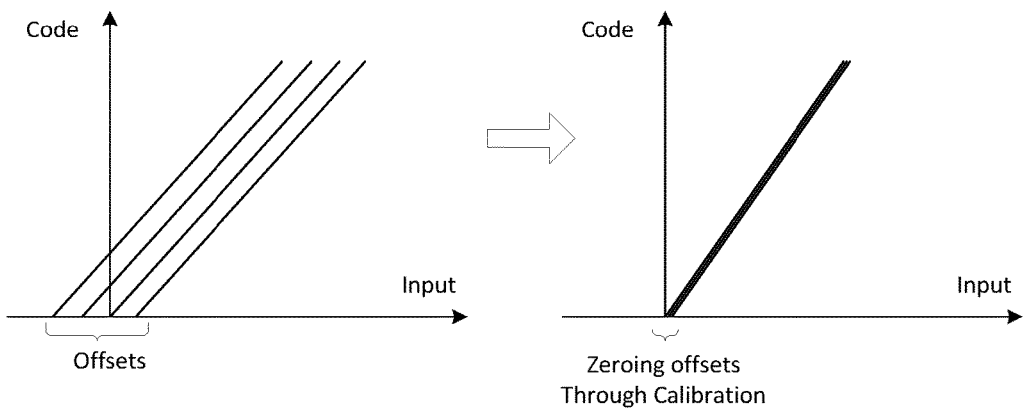
FIG. 2 is a diagram showing the zeroing of offsets in an analog-to-digital converter of a receiver.

Turning now to FIG. 2, a diagram shows the zeroing of offsets in an analog-to-digital converter of a receiver to accommodate for offset voltage mismatch. While the example of FIG. 2 and other figures shows four-channels, there can be any number of channels in general. Due to mismatch in offset voltage, transfer curves of the different ADC circuits (known as sub-ADC circuits for individual channels of the TI-ADC) are distributed around the origin. As shown in FIG. 2, the outputs of the different channels shows how the amplitude of the analog input signal (shown on the input axis) is different for a give code (representing the digital output value y[n]). The offset voltages and therefore mismatch between multiple channels are cancelled after the calibration, so transfer curves of the different ADCs start from the origin, where a code value represented by y[n] is the same for any input value associated with the analog input signal x(t) for each of the ADC channels.

Figure 3:
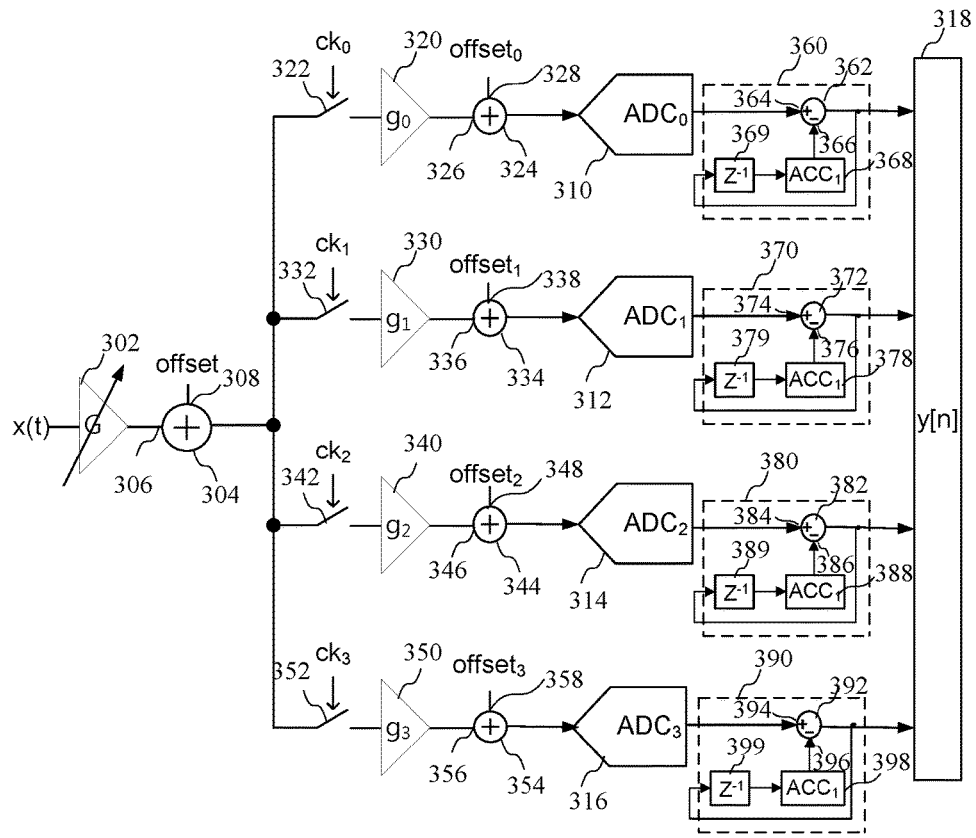
FIG. 3 is a block diagram of a circuit for zeroing offsets in an analog-to-digital converter.

Turning now to FIG. 3, a block diagram of a circuit for zeroing offsets in a plurality of channels of an analog-to-digital converter is shown. In particular, an amplifier circuit 302 (representing a gain stage for all of the ADCs of the TI ADC circuit of FIG. 3) is configured to receive an analog input signal x(t), where an amplified analog input signal generated at the output of the amplifier circuit 302 is coupled to an adder circuit 304 at an input 306. An offset signal coupled to a second input 308 of the adder circuit 304 is a modelled common offset voltage at the input of the whole TI ADC. The source of the common offset at input 308 is offset voltage in any preceding stage of the TI-ADC and/or TI ADC itself. It is therefore applied to the analog signal applied to each of the ADC channels having an ADC circuit of FIG. 5. However, a separate offset signal is generated in each of the ADC channels, as will be described in more detail below.

The amplified analog input signal generated at the output of the adder circuit 304 is provided to each of a plurality of channels of the TI ADC of FIG. 3, including a first channel having a first ACD circuit 310, a second channel having a second ADC circuit 312, a third channel having a third ADC circuit 314, and a fourth channel having a fourth ADC circuit 316. Outputs of the ADC circuits are stored as a digital value y[n] representing the analog input signal x(t) in a memory element 318. The first ADC channel comprises an amplifier circuit 320 representing a gain stage for the channel and configured to receive the analog input signal by way of a switch 322. The switch 322 is controlled by a first control signal, which is clock signal $ck_0$. The $ck_0$ signal is one of a plurality of clock signals that enable time interleaving of the channels of the TI ADC of FIG. 3. An output of the amplifier circuit 320 is coupled to a first adder circuit 324 at an input 326. A first offset signal $offset_0$ associated with the analog input signal of the first channel is coupled to an input 328 of the adder circuit 324. An output of the adder circuit 324 is coupled to the ADC circuit 310.

The second ADC channel comprises an amplifier circuit 330 configured to receive the analog input signal by way of a switch 332 that is controlled by a second control signal $ck_1$. An output of the amplifier circuit 330 is coupled to a second adder circuit 334 at an input 336. A second offset signal $offset_1$ associated with the second channel is coupled to an input 338. An output of the adder circuit 324 is coupled to the ADC circuit 312.

The third ADC channel comprises an amplifier circuit 340 configured to receive the analog input signal by way of a switch 342 that is controlled by a third control signal $ck_2$. An output of the amplifier circuit 340 is coupled to a third adder circuit 344 at an input 346. A third offset signal $offset_2$ associated with the third channel is coupled to an input 348. An output of the adder circuit 344 is coupled to the ADC circuit 314.

The fourth ADC channel comprises an amplifier circuit 350 configured to receive the analog input signal by way of a switch 352 controlled by a fourth control signal $ck_3$. An output of the amplifier circuit 350 is coupled to a fourth adder circuit 354 at an input 356. A fourth offset signal $offset_3$ associated with the fourth channel is coupled to an input 358. An output of the adder circuit 354 is coupled to the ADC circuit 316.

The adder before the ADC models an input referred offset voltage of the ADC, while separate offset voltage control signals are provided at the outputs of each of the ADC circuits in each of ADC channels to subtract a calculated offset voltage for each of the channels. A first offset voltage control circuit 360 compensates offset voltage of the digital output of the ADC circuit, such as the undesirable offset shown in FIG. 2, and comprises a subtractor circuit 362 configured to receive the digital signal generated at the output of the ADC circuit at an input 364. A second input 366 is coupled to receive an output of an accumulator circuit 368 that receives outputs of the subtractor circuit 362 stored in a memory element 369. Accordingly, the offset voltage control circuit 360 provides offset voltage control of the digital output of the ADC circuit 310, where the offset voltage control is associated with the individual channel having the ADC circuit 310.

A second offset voltage control circuit 370 compensates for amplitude offset voltage of the digital value generated in the second ADC channel, and comprises a subtractor circuit 372 configured to receive the digital signal generated at the output of the ADC circuit at an input 374. A second input 376 is coupled to receive an output of an accumulator circuit 378 that receives outputs of the subtractor circuit 372 stored in a memory element 379. Similarly, a third offset voltage control circuit 380 compensates for offset voltage of the digital value generated in the third ADC channel, and comprises a subtractor circuit 382 configured to receive the digital signal generated at the output of the ADC circuit at an input 384. A second input 386 is coupled to receive an output of an accumulator circuit 388 that receives outputs of the subtractor circuit 382 stored in a memory element 389. Finally, a fourth offset voltage control circuit 390 compensates for offset voltage digital value generated in the third ADC channel, and comprises a subtractor circuit 392 configured to receive the digital signal generated at the output of the ADC circuit at an input 394. A second input 396 is coupled to receive an output of an accumulator circuit 398 that receives outputs of the subtractor circuit 392 stored in a memory element 399. As will be described in more detail below, the control signals (i.e. clock signals $ck_0$, $ck_1$, $ck_2$, $ck_3$) coupled to the switches 322, 332, 342, and 352 are selectively implemented to enable time interleaving of the outputs of the ADC circuits to generate the digital representation y[n] of the analog inputs signal x(t).

Figure 4:
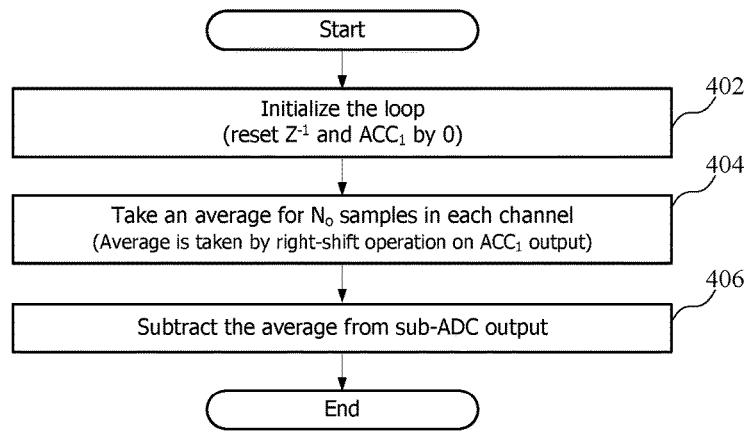
FIG. 4 is a flow chart showing a method of implementing the circuit of FIG. 3.

The flow chart of FIG. 4 shows a method of implementing the circuit of FIG. 3, where the calibration loop of the first channel includes the memory element 369, an accumulator circuit 368, and the subtractor circuit 362. While the calibration may be described by way of example with respect to the first ADC channel, it should be understood that the calibration is performed for each of the ADC channels. The calibration loop in the offset voltage control circuit 360 is initialized by setting initial values of the memory element 379 and the accumulator 387 to 0 at a block 402. The loop then accumulates the ADC output for a predetermined number of samples, and generates an average for the predetermined number of samples at a block 404. By way of example, the average may be taken by right-shift bit operation to avoid consuming any additional digital resources. An average associated with an ADC represents an offset voltage of the channel that includes the ADC circuit, and it is subtracted from each that ADC output to cancel out offset voltage in digital domain at a block 406. That is, by continuously sampling the output signal of the ADC, an average offset associated with the channel can be determined after a predetermined number of samples, and that offset can be subtracted from the digital output to generate the correct value of the digital output.

Turning now to FIG. 5, a block diagram of another circuit for zeroing offsets enables determining a residual offset in an analog-to-digital converter. In the implementation of FIG. 5, each offset voltage control circuit includes a second accumulator circuit coupled between the accumulator circuit and the subtractor circuit. More particularly, a second accumulator circuit 502 is coupled between the accumulator circuit 368 and the subtractor circuit 362 of the offset voltage control circuit 370. A second accumulator circuit 504 is coupled between the accumulator circuit 378 and the subtractor circuit 372 of the offset voltage control circuit 370. A third accumulator circuit 506 is coupled between the accumulator circuit 388 and the subtractor circuit 382 of the offset voltage control circuit 380. Finally, a fourth accumulator circuit 508 is coupled between the accumulator circuit 398 and the subtractor circuit 392 of the offset voltage control circuit 390.

According to the implementation of FIG. 5, the calibration loop includes the second accumulator (ACC2) that accumulates output of the first accumulator (ACC1) in each ADC channel to cancel out residual offset voltage in the previous calibration cycle. As shown in the flow chart of FIG. 6, a calibration operation is performed for each channel. The calibration loop is initialized by setting an initial value of memory element and the two accumulators to 0 at a block 602. The calibration loop then accumulates ADC outputs in each channel for a predetermined number of samples $N_0$ and generates an average value at a block 604. An average may be taken by a right-shift bit operation to avoid consuming any additional digital resources. Each average (i.e. the output of the first accumulator 368) represents an offset voltage of the channel that includes the ADC circuit, such as ADC circuit 310 for the first channel. The output of the first accumulator circuit 368 is provided to the second accumulator circuit 502, which accumulates the output of the first accumulator circuit 368 to further cancel out any residual offset voltage of the ADC channel, at a block 606. The output of the second accumulator circuit 502 is subtracted from the output of the ADC 310 to cancel out offset voltage in digital domain at a block 608. Before repeating the calibration process, the memory element and the first accumulator (ACC1) must be reset to 0 at a block 610. That is, the calibration process of FIG. 6 is an iterative process where a predetermined number of average values (generated by the first accumulator ACC1 after $N_0$ samples) are processed by the second accumulator ACC2. The calibration is finished is finished at a block 612 after a predetermined number of average values are generated by the second accumulator. The calibration can run in background while TI ADC operates, but a system can set a predetermined number of average values to finish the calibration if needed.

Figure 7:
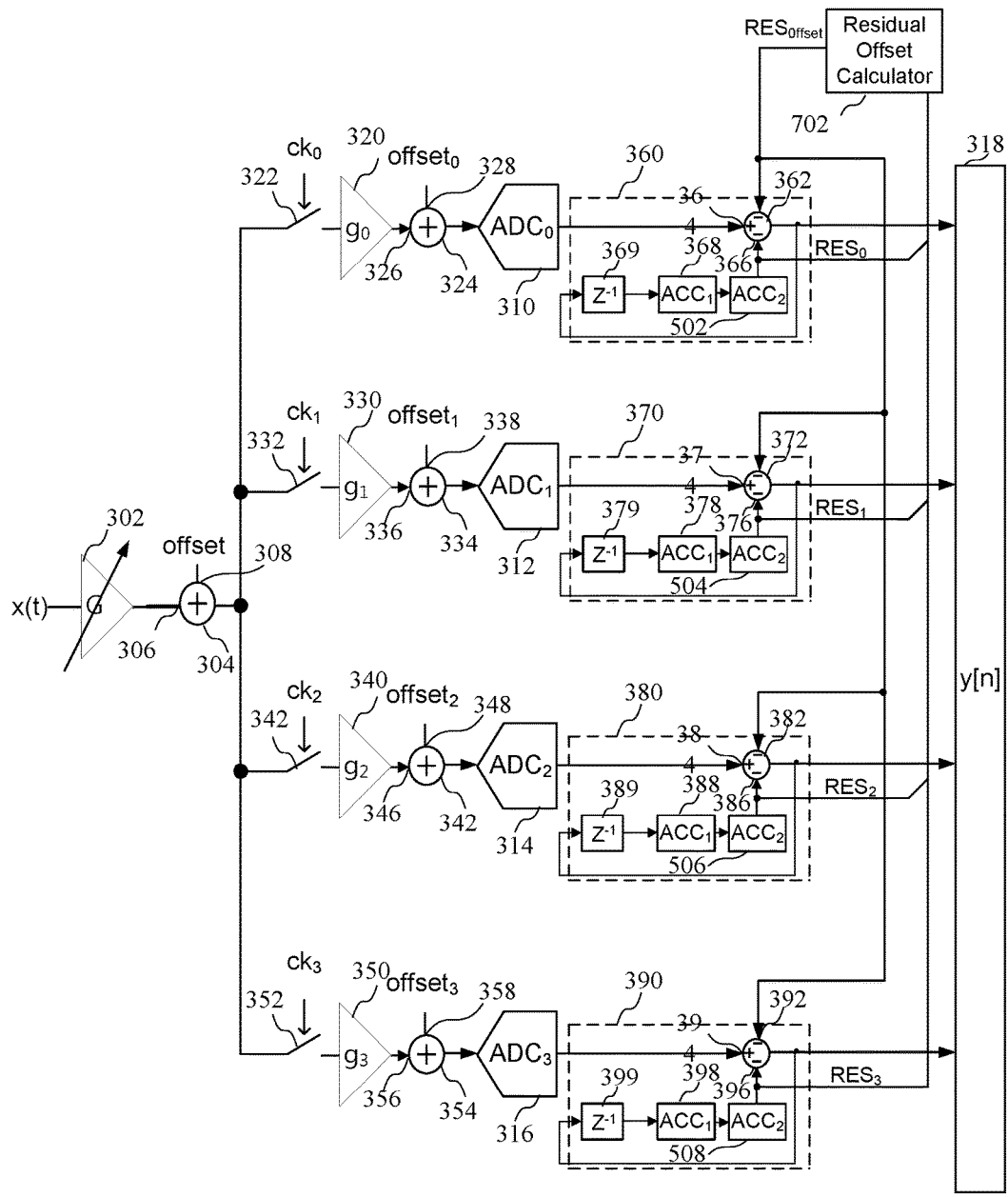
FIG. 7 is a block diagram of another circuit for zeroing offsets having a residual offset calculator for determining an average residual offset in an analog-to-digital converter.

Turning now to FIG. 7, a block diagram of another circuit for zeroing offsets including a residual offset calculator for determining an average residual offset in an analog-to-digital converter is shown. As shown in FIG. 7, a residual value generated by each of the second accumulators for each of the ADC channels is provided to a residual offset calculator to generate a residual offset for the TI ACD circuit. More particularly, a residual offset calculator 702 is coupled to receive the residual output ($RES_0$) of the first accumulator circuit 502 of the first offset voltage control circuit 360, the residual output ($RES_1$) of the second accumulator circuit 504, the residual output ($RES_2$) of the third accumulator circuit 506, and the residual output ($RES_3$) of the fourth accumulator circuit 508. The residual offset calculator 702 generates an average residual offset value that is coupled to each of the offset voltage control circuits 360, 370, 380, and 390. That is, an average residual offset value is subtracted, for each of the ADC channels, from the output of the ADC circuit.

Figure 8:
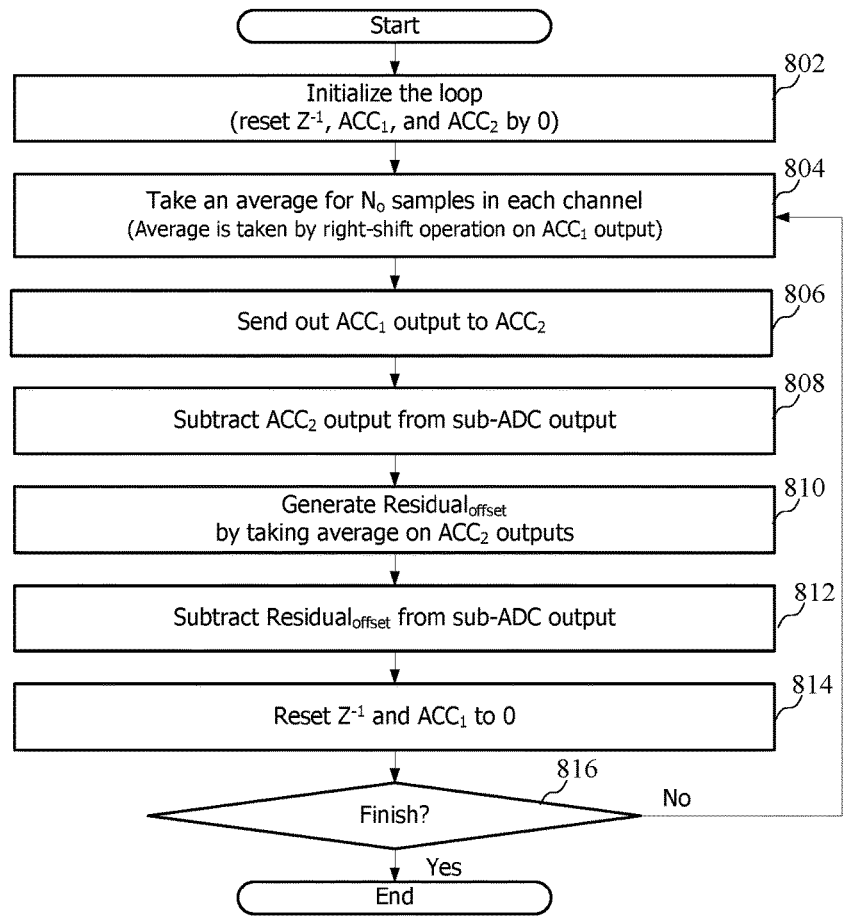
FIG. 8 is a flow chart showing a method of implementing the circuit of FIG. 7.

As described in the flow chart of FIG. 8, the calibration loop is initialized by setting initial value of the memory element and each of the accumulators to 0 at a block 802. The loop then accumulates, for each ADC channel, the ADC output for a predetermined number of samples and generates an average at a block 804. An average may be taken by right-shift bit operation for example. As described above in reference to FIG. 6, the output of the first accumulator circuit 368 is provided to the second accumulator circuit 502, which accumulates the first accumulator output to further cancel out any residual offset voltage of the ADC channel, at a block 806. The output of the second accumulator circuit 502 is subtracted from the ADC output to cancel out offset voltage in digital domain at a block 808. The residual offset ($RES_{offset}$) for the TI ADC is then generated by taking the average of the second accumulator outputs for each of the channels at a block 810. The residual offset is then subtracted, for each ADC channel, from the ADC output at a block 812 to cancel the common offset at the output of the TI-ADC. The memory element and the first accumulator are reset to zero at a block 812, and it is determined whether calibration is finished at the step 816. The residual offset calibration of FIG. 7 can therefore compensate for any offset voltage in a preceding stage of TI-ADC in digital domain, and therefore eliminate complex offset compensation analog circuits in the preceding stage. The calibration may be finished after a predetermined number of iterations are performed to cancel any residual offset as described above in reference to FIG. 5.

Figure 9:
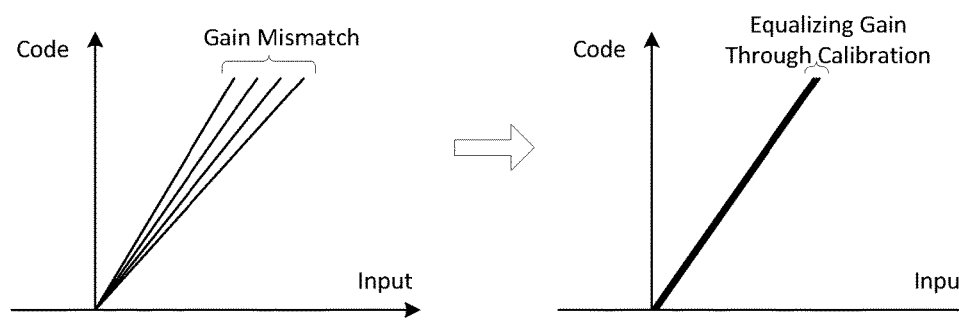
FIG. 9 is a diagram showing the equalization of gain in an analog-to-digital converter of a receiver.

Turning now to FIG. 9, a diagram shows the equalization of gain in an analog-to-digital converter of a receiver having a plurality of ADCs. Gain mismatch results when different ADCs have different code values (i.e. output values y[n]) in different ADC circuits for a given input voltage associated with the analog input signal x(t)). When the gain is equalized, the code value is the same for each of the ADCs for a given input voltage associated with an analog input signal, as shown after the gain is equalized in FIG. 9.

Figure 10:
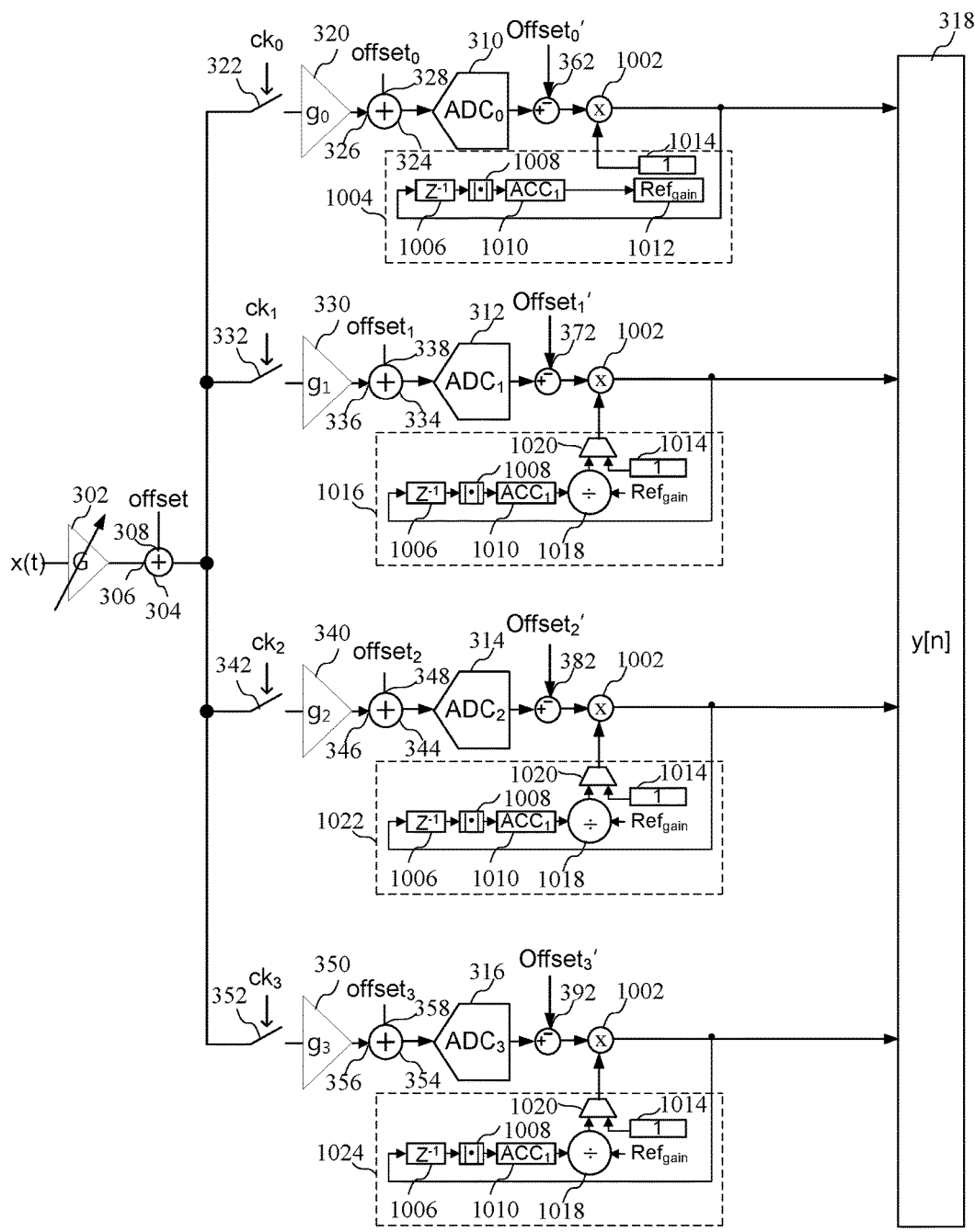
FIG. 10 is a block diagram of a circuit enabling the equalization of gain in an analog-to-digital converter of a receiver.
Figure 12:
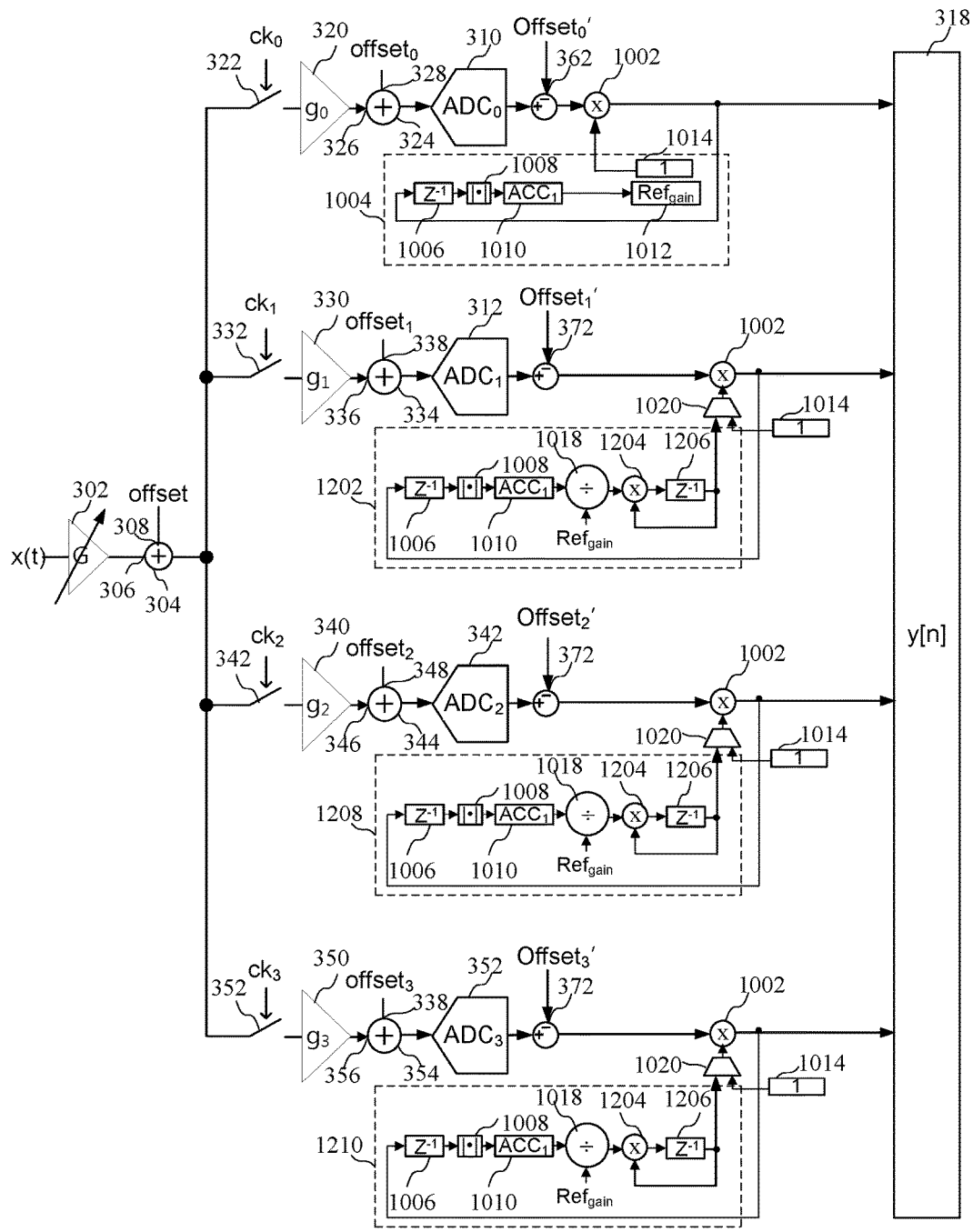
FIG. 12 is another block diagram of a circuit enabling the equalization of gain in an analog-to-digital converter of a receiver.

The circuits of FIGS. 10 and 12 show additional elements for enabling gain equalization. While the implementation of gain equalization is novel separate from offset cancellation shown here receiving the offset signals designated with as offset' (i.e. offset$_0$' coupled to subtractor circuit 362, offset$_1$' coupled to subtractor 372, offset$_2$' coupled to subtractor circuit 382, and offset$_3$' coupled to subtractor 382), it should be understood that gain equalization can be performed in addition to the offset calibration shown in FIGS. 3, 5 and 7. The sharing of hardware resources for providing gain equalization and offset cancellation will be further described below in reference to FIG. 18. As shown in FIG. 10, each ADC channel comprises a multiplier circuit 1002 (preferably after the subtractor circuit enabling offset cancellation in the ADC channel as described in FIGS. 3, 5 and 7) to enable gain control. That is, in addition to providing offset control for the digital signal after the ADC as described in FIGS. 2-8, gain control is provided in each ADC channel to ensure that correct gain is provided in each channel.

Due to mismatch in gain, gain of each sub-channel has different slope as shown in FIG. 9. For the gain mismatch calibration, a reference channel is needed, where its gain is a reference gain, and gain mismatch is calibrated in relative to the reference gain. The block diagram of the TI-ADC arrangement of FIG. 10 includes four channels by way of example, but there can be any number of channels. The reference channel is the first channel (i.e. the channel with ADC 310) in this example, and it always has a gain correction constant of '1' provided to the multiplier 1002. The calibration loop of the remaining channels comprises a memory element 1006, an absolute value circuit 1008, an accumulator 1010, a divider 1018, a selection circuit 1020, and the multiplier 1002. Accordingly, the gain of each ADC channel is separately calibrated, and calibrated with respect to a reference ADC channel.

More particularly, in a first gain control circuit 1004, a unity gain value, represented by a logical "1" in the memory element 1014, is provided to a first input of the multiplier 1002, which is also coupled to receive an output of the ADC circuit by way of the subtractor circuit 362. That is, an input to the multiplier is the offset adjusted output of the ADC circuit. A reference gain is also calculated by the gain control circuit 1004 in the first channel, where output of the multiplier 1002 of the first channel is coupled to a memory element 1006, an output of which is coupled to an absolute value circuit 1008. An accumulator receives the output of the absolute value circuit 1008 to generate the reference gain ($Ref_{gain}$), which is stored in a memory element 1012. That is, in order to achieve uniform gain between the various channels, a reference gain associated with a selected channel is determined, and the reference gain is used by a multiplier in the gain control circuits of the other channels to ensure that the gain of each of the channels is the same. For example, in a second gain control circuit 1016, a divider circuit 1018 is coupled to receive the output of the accumulator circuit 1010 and the reference gain value. An output of the divider circuit of the second channel, which comprises a scaled value (based upon the reference gain) of the second channel, is provided to a first input of a selection circuit 1020, shown here as a multiplexer, which also receives the unity gain value from the memory element 1014.

The unity gain value is selected as an initial value in each of the channels, and then the output of the divider circuit 1018 is selected after the reference gain associated with the first channel is determined. The reference gain value is then used by each of the remaining channels, including the gain control circuit 1022 associated with the third channel and the gain control circuit 1024 associated with the fourth channel), to ensure that the gain of the digital value generated by ADC circuits of the channels is the same.

Figure 11:
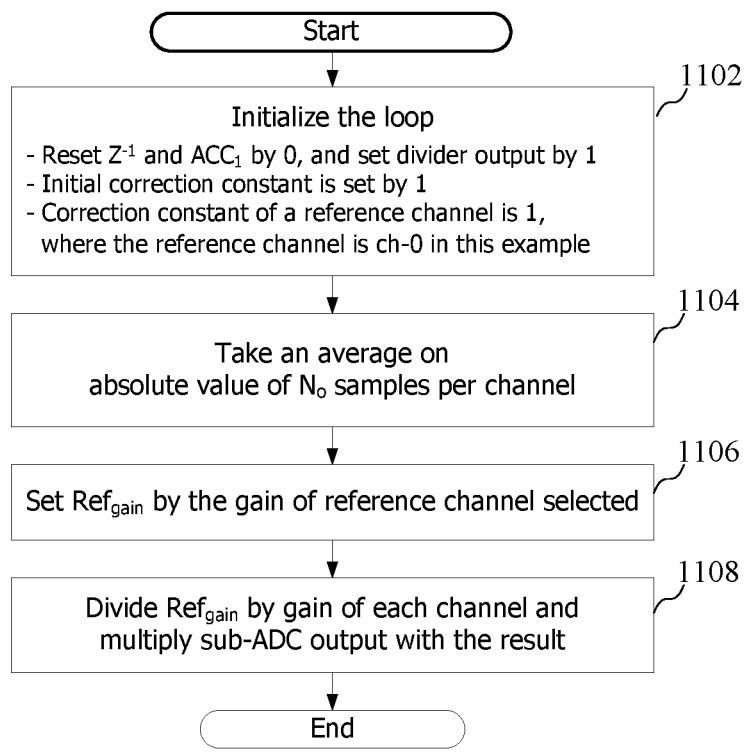
FIG. 11 is a flow chart showing the operation of the circuit of FIG. 10.

The gain calibration operation of FIG. 10 is described in reference to FIG. 11. The loop is initialized at a block 1102 by setting initial values of the memory element 1006 and the accumulator 1010 with 0, and setting the initial gain correction value provided to the multiplier 1002 to constant value of '1' for all ADC channels. Then, the loop accumulates absolute values of each ADC output for a predetermined number $N_0$ samples and generates an average, such as by a right-shift bit operation, at a block 1104. The average, as determined for each channel, represents signal power received on the channel that includes an ADC circuit. The reference gain ($Ref_{gain}$) is set by the gain of a selected reference channel at a block 1106, shown here by way of example as the first channel. The average is divided by the reference gain (Ref gain) representing the signal power of the reference channel at a block 1108. The output of the divider is a gain correction constant for the channel, and is therefore multiplied by the ADC output for that channel. As a result, gain of each channel is equalized to the gain of the reference channel.

Turning now to FIG. 12, another block diagram of circuit enabling the equalization of gain in an analog-to-digital converter of a receiver is shown, and particularly provides gain mismatch calibration for an accumulative operation. The reference channel of the implementation of FIG. 12 is also the first channel by way of example, and it always has a gain correction constant of '1'. The gain control circuit 1004 is also implemented for the first channel in FIG. 12. In addition to the elements of FIG. 10, a multiplier 1204 and a second memory element 1206 are provided in the gain control circuits 1202, 1208 and 1210 of the remaining channels. Therefore, the calibration loop of the implementation of FIG. 12 comprises the memory element 1006, the absolute value circuit 1008, the accumulator 1010, the divider 1018, the selection circuit 1020, a multiplier 1204, a memory element 1206, and the multiplier 1002. Rather than providing the output of the divider circuit 1018 to the multiplier 1002, the output of the divider circuit 1018 is provided to the multiplier 1204, which is also coupled to receive the value stored in the memory element 1206 that is provided to the selection circuit 1020. Therefore, an iterative process is performed, where the gain correction constant for the channel is updated as the output of ACC1 is updated.

Figure 13:
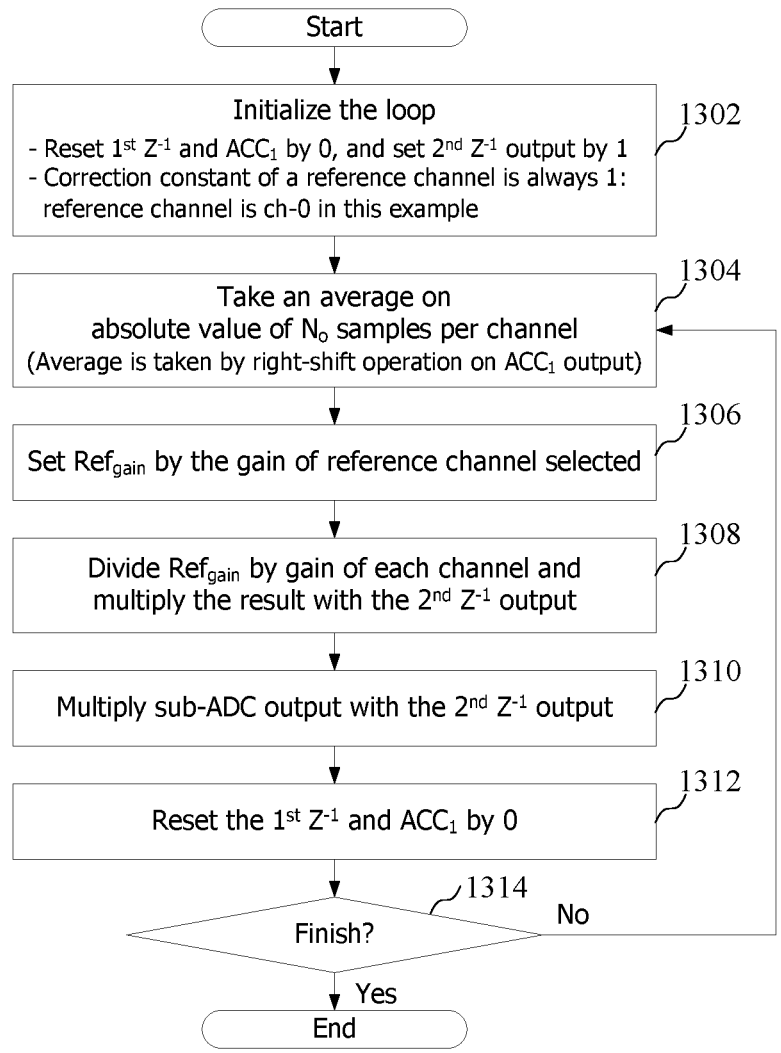
FIG. 13 is flow chart showing the operation of the circuit of FIG. 12.

The gain calibration according to the implementation of FIG. 12 is described in reference to FIG. 13. The calibration is initialized by setting initial value of the memory element 1006 and the accumulator 1010 to 0 and the memory element 1206 to 1 at a block 1302. A correction constant is also set equal to 1 for the reference channel. Then, the loop generates an average by accumulating an absolute value of an ADC output for the channel for $N_0$ samples at a block 1304. The average may be generated by a right-shift bit operation for example. The average represents the signal power received by the channel having the ADC. A reference gain is set as the gain of a selected reference channel at a block 1306. The average for a channel is divided by the reference gain ($Ref_{gain}$) that is a signal power of the reference channel at a block 1308, where the output of the divider is a correction constant for the channel for the calibration sequence. The current gain correction constant is multiplied by the previous one at a block 1310, and applied for the gain correction to correct any residual gain error caused by irregular interrupts. After the first memory element 1006 and the accumulator 1010 are reset at a block 1312, the calculation of the gain value can be performed again. This step can be repeated to continuously equalize gain of each channel to the gain of the reference channel or until it is determined whether the calibration is completed at a block 1314.

Figure 14:
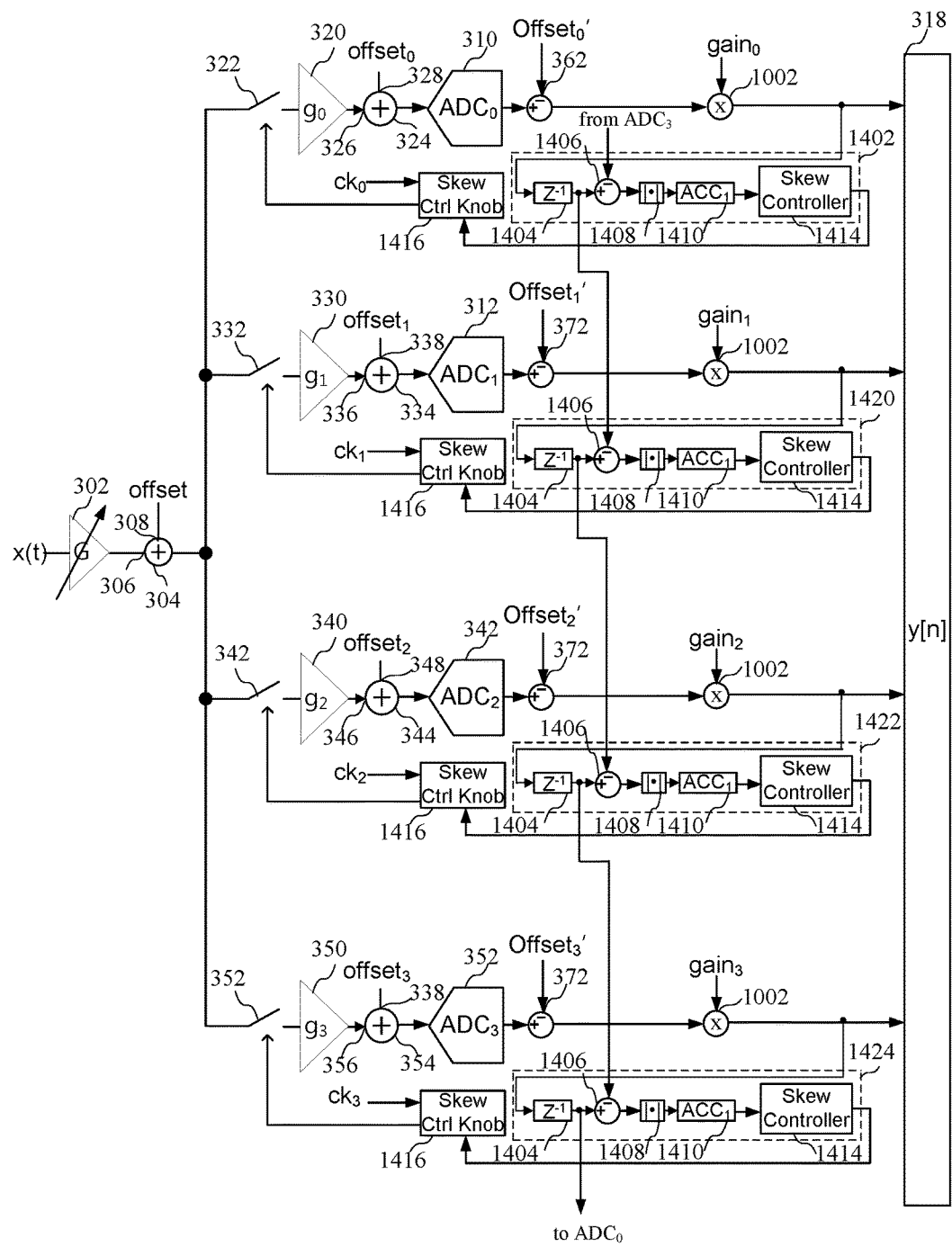
FIG. 14 is a block diagram of a circuit enabling skew control in an analog-to-digital converter of a receiver.
Figure 15:
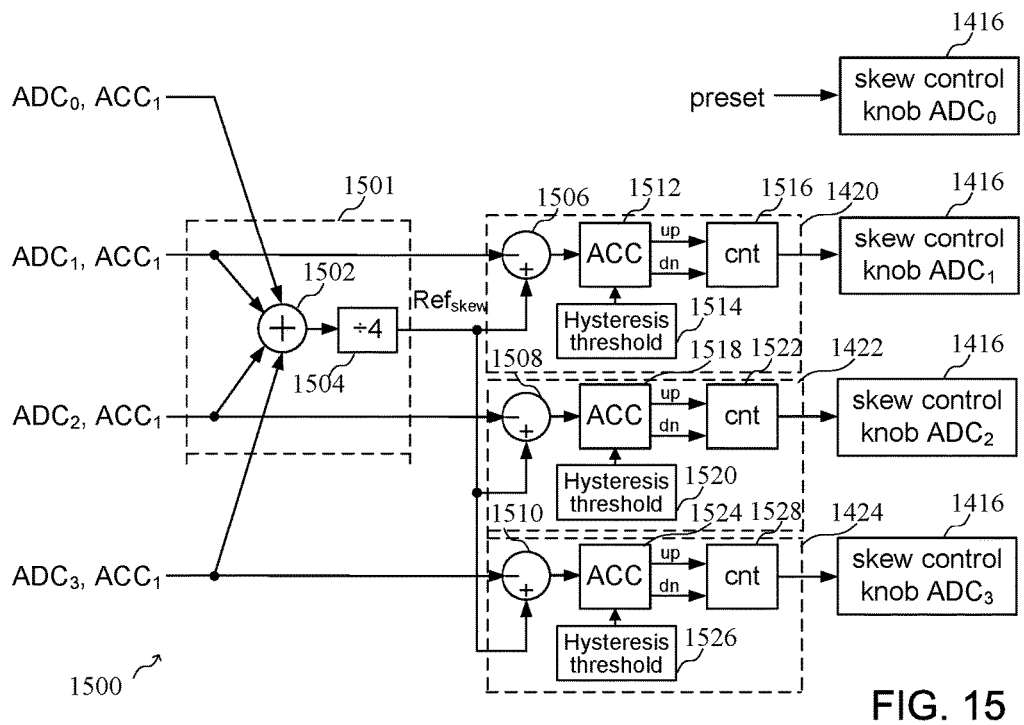
FIG. 15 is a block diagram of a skew control circuit of FIG. 14.
Figure 16:
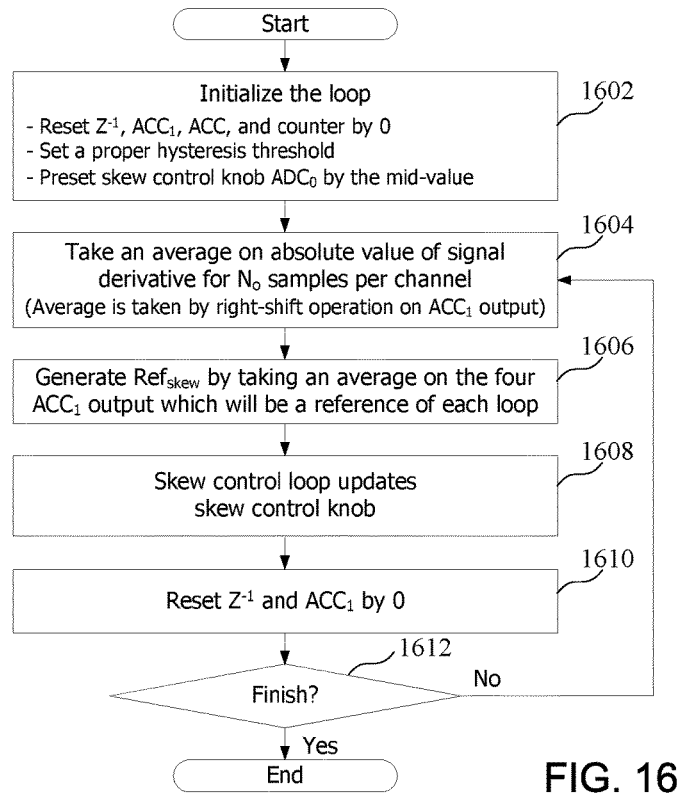
FIG. 16 is a flow chart showing the operation of the skew control circuit of FIG. 15.

Turning now to FIG. 14, a block diagram of a circuit enabling skew control in an analog-to-digital converter of a receiver is shown. In addition to providing gain and offset correction for each channel, the circuit of FIG. 14 compensates for skew between the channels. While the skew control implemented as described in FIGS. 14-16 is novel standing alone, skew control can also be implemented in conjunction with offset correction and gain control as shown in FIGS. 12-13, where the offset control signal and the gain control signal (e.g. $offset_0$ and $gain_0$) of FIG. 14 are generated and provided to the subtractor circuit 362 and the multiplier 1002 in the first channel as described above. A skew control circuit 1402 is coupled to receive the output of the ADC circuit by way of the multiplier circuit 1002 as shown, and generates a clock signal that controls the switch 322. More particularly, the skew control circuit 1402 comprises a memory element 1404 configured to receive an output of the multiplier circuit 1002, where an output of the memory element 1404 is coupled to a subtractor circuit 1406 that is configured to subtract an output of the memory element 1404 of previous channel. In the case of the first channel, the subtract circuit 1406 receives an output of the memory element 1404 of the last channel, as shown in FIG. 14. An absolute value circuit 1408 is coupled to an output of the subtractor circuit 1406 and provides the absolute value of the difference generated by the subtractor circuit to an accumulator 1410. An output of the accumulator 1410 is coupled to a skew controller 1414. An example of the skew controller 1414 is provided in more detail in reference to FIG. 15. An output of the skew controller 1414 is provided to skew control knob 1416 that receives corresponding clock signal for the channel, where each of the channels receives a separate clock signal $ck_0$, $ck_1$, $ck_2$ and $ck_3$ to enable time interleaving of the ADCs as described above. The skew control knob generates a control signal that controls the switch 322 for the first channel. The skew controller 1414 of the first stage generates a preset control signal for the first channel, which is the reference channel, while the skew controller 1414 of the remaining channels compensates for skew of the remaining channel with respect to the first channel.

Turning now to FIG. 15, a block diagram of a skew control circuit 1500 that implements the skew control circuits 1420, 1422, and 1424 of FIG. 14 is shown. A preset skew control signal is provided to the skew control knob 1416 associated with the first channel (i.e. the channel having $ADC_0$ 310). The skew control circuit 1500 comprises a reference skew generator 1501 having an adder circuit 1502 coupled to receive an output of accumulators 1410 of each of the channels as shown, where an output of the adder 1502 is provided to a divider circuit 1504 to generate an average value representing a reference skew ($Ref_{skew}$) for the outputs of the accumulators.

The average value is provided to a corresponding subtractor circuit for each of the channels. More particularly, the output of the accumulator 1410 for the $ADC_1$ channel is provided to a subtractor circuit 1506 of the skew controller 1420 and is subtracted from the reference skew. An output of the subtractor circuit 1506 is provided to an accumulator 1512 that receives a hysteresis threshold 1514, where the accumulator generates an up or down value to a counter 1516. An output of the counter 1516 is provided to the skew control knob 1416 for the $ADC_1$ channel, where the skew control knob 1416 generates a control signal that controls the switch 332 based upon the $ck_1$ signal as described in reference to FIG. 14.

The skew control circuits 1422 and 1424 operate in a similar manner, where the output of the accumulator 1410 for the third channel is provided to a subtractor circuit 1508 and is subtracted from the reference skew and the output of the accumulator 1410 for the fourth channel is provided the subtractor circuit 1510 of the fourth channel and is subtracted from the reference skew. An output of the subtractor circuit 1508 is provided to an accumulator 1518 that receives a hysteresis threshold 1520, where the accumulator generates and up or down value to a counter 1522. An output of the counter 1522 is provided to the skew control knob 1416 for the third channel. Similarly, the output of the accumulator 1410 for the fourth channel is provided to a subtractor circuit 1510 and is subtracted from the reference skew. An output of the subtractor circuit 1510 is provided to an accumulator 1524 that receives a hysteresis threshold 1526, where the accumulator generates and up or down value to a counter 1528. An output of the counter 1528 is provided to the skew control knob 1416 for the fourth channel.

Turning now to FIG. 16, a flow chart shows the operation of the skew control circuit of FIG. 15. During an initialization phase at a block 1602, a memory device and accumulator for the channel and the counter are set to 0. Also, a hysteresis threshold, which controls gain of skew control loop, has to be set by a proper value, and preset skew control code in the first channel is set to half of the full range. The calibration circuit then calculates average absolute value of the ACC1 output for the derivative of input signal in each channel at a block 1604. A reference skew value ($REF_{skew}$) for the skew calibration is calculated at a block 1606. The reference skew value can be calculated by taking an average of the four accumulator outputs as described in above in reference to FIG. 15. Then, accumulator output of each channel is compared with the reference skew ($REF_{skew}$) to update the loop parameter and code of skew control knob at a block 1608. It is then necessary to reset memory element ($Z^{-1}$) and the accumulator (ACC1) to 0 for the next iteration of the calibration process. If skew calibration has to be repeated at block 1610, the process returns to block 1604, and the process is repeated until the calibration process is completed.

Figure 17:
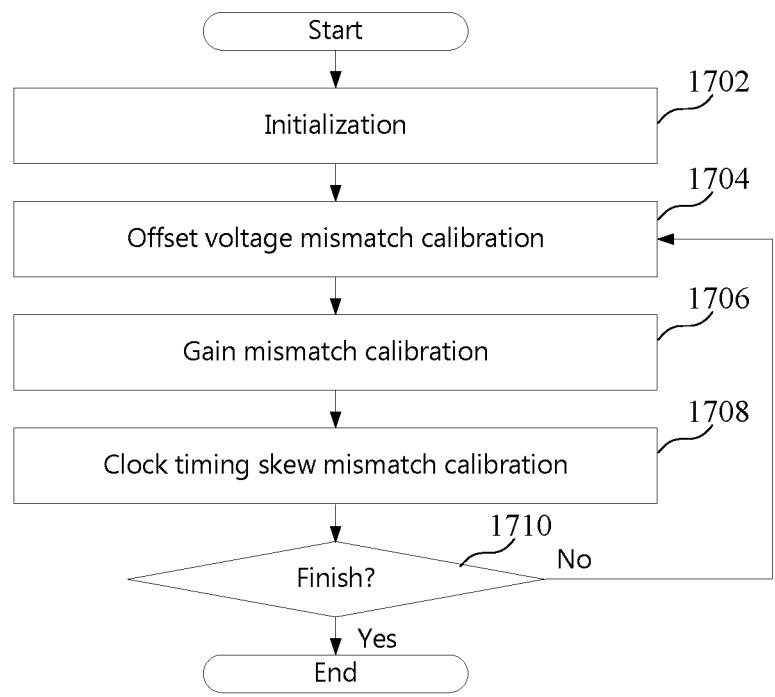
FIG. 17 is a flow chart showing the operation of a circuit enabling compensation for mismatch in offset, gain and skew in an analog-to-digital converter.

Turning now to FIG. 17, a flow chart shows the operation of a circuit such as the circuit of FIG. 16 that enables compensation for mismatch for offset, gain and skew. The calibration process begins with an initialization process at a block 1702, where storage elements and accumulators are set to zero. After initialization, the calibration process enables compensating for the offset voltage mismatch first at a block 1704, then performs gain mismatch calibration at a block 1706. Finally, the calibration process detects and corrects clock timing skew mismatch at a block 1708. Offset voltage and gain mismatch calibration can be accomplished in a single cycle, but can be repeated with an accumulative calibration process as described above. For accumulative calibration process, the proposed background calibration can slow down its update rate when all mismatch parameters are calibrated to meet the system requirement. In that way, any degradation in mismatch by environmental variation surrounding the system can be calibrated. Also, the system can turn off the calibration once all mismatch parameters are calibrated if needed since offset voltage, gain, and clock timing skew are dc parameters.

Figure 18:
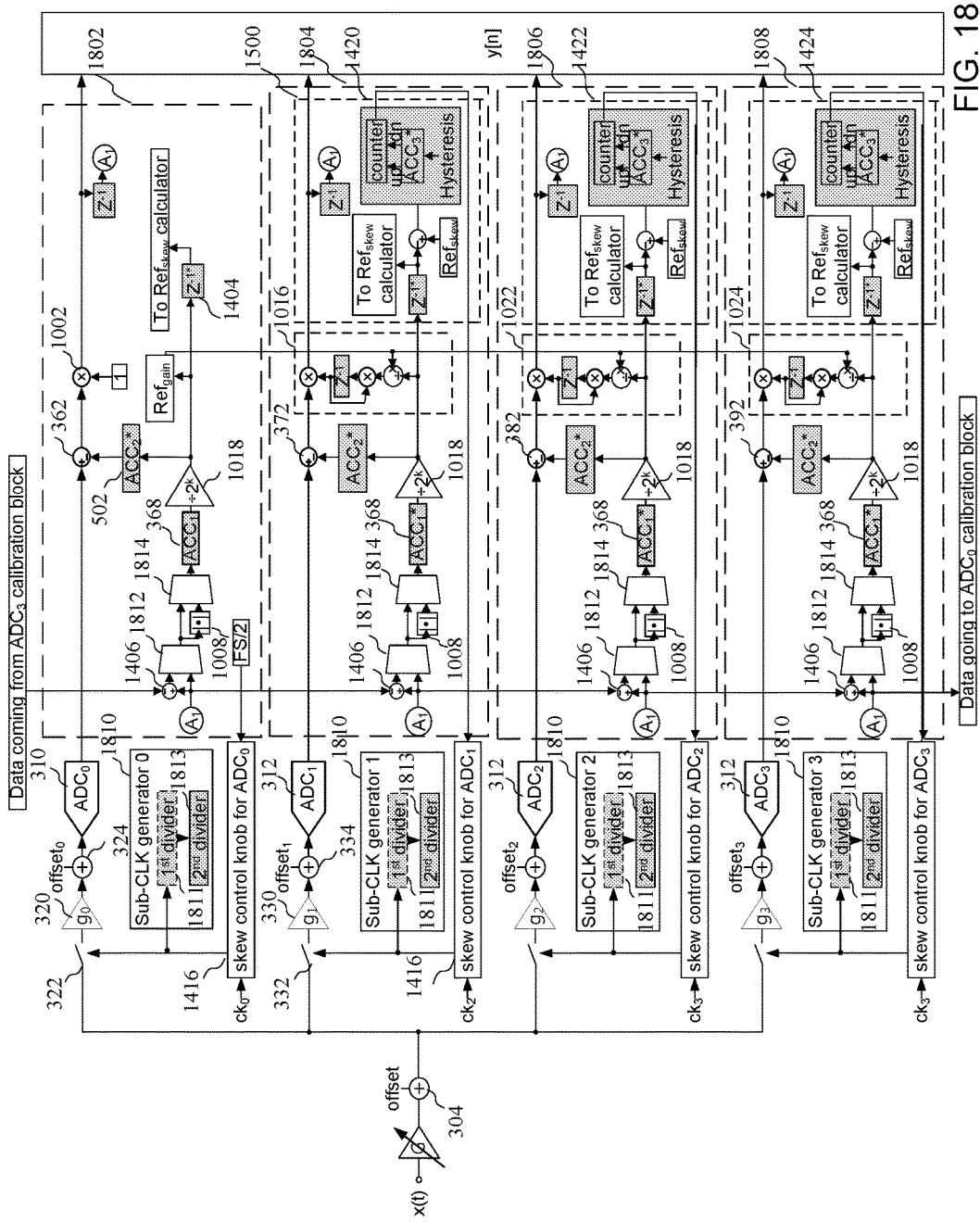
FIG. 18 is a block diagram of showing the implementation of shared resources for implementing analog-to-digital converters of a receiver.

Turning now to FIG. 18, a block diagram shows the implementation of shared resources for implementing analog-to-digital converters of a receiver. The block diagram of a TI-ADC of FIG. 18 enabling a mismatch calibration algorithm for offset voltage, gain, and clock timing skew allows common elements of the different circuits eliminating mismatch to be shared in each of the channels 1802, 1804, 1806, and 1808. Depending on the type of calibration, input to ACC1 in each of the channels is selected through the two stage multiplexer. Sub-CLK generator0-3 1810 generate clock signals at two difference frequencies. The first divider 1811 generates a clock signal at frequency (fck0-3)/4*N0 for ACC1 and the memory element $Z^{-1}$ of the skew control circuit, where fck0-3 is sampling rate of sub-ADC0-3, 4 is an interleaving factor (i.e., 4 in this example), and $N_0$ is a number of samples taken for a single calibration. The second divider 1813 further divides first divider's output to generate clock signals for ACC2 and $Z^{-1}$ of the gain control circuit. Since the implementation of FIG. 18 uses an average for offset mismatch calibration and average absolute value for gain and clock timing skew calibration, most of the digital hardware can be shared in each step by selection circuits 1812 and 1814. Also, using absolute value needs much less hardware than using multipliers, resulting in highly efficient digital resource usage and power consumption.

Figure 19:
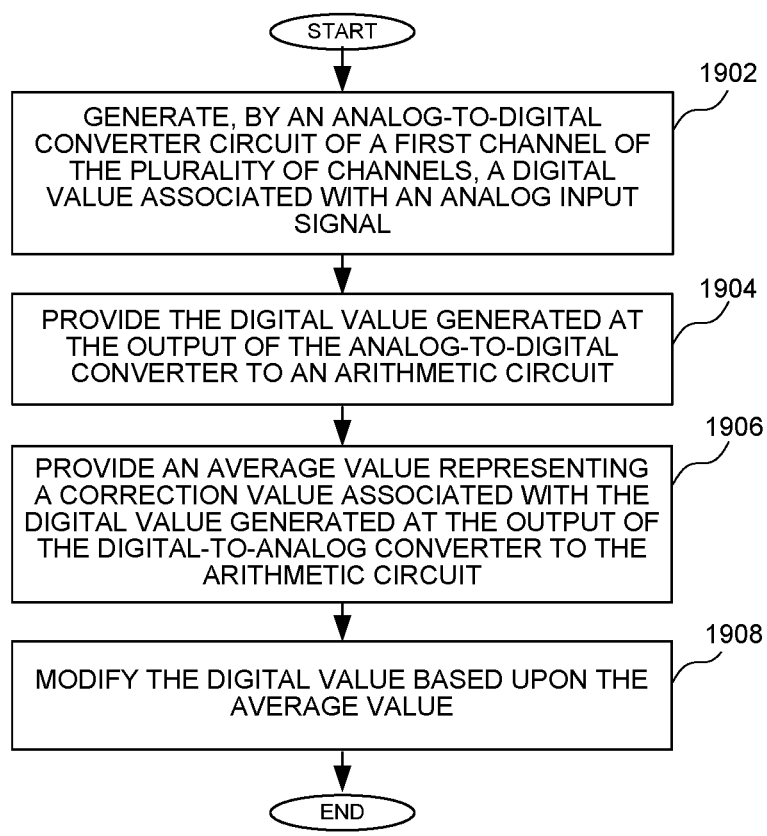
FIG. 19 is a flow chart showing a method of compensating for offset in an analog-to-digital converter.

Turning now to FIG. 19, a flow chart shows a method of compensating for offset in an analog-to-digital converter. The method of FIG. 19 can be implemented in any of implementations of FIGS. 1-18. In particular, a digital value associated with an analog input signal (x(t)) is generated by an analog-to-digital converter circuit such as ADC 310 of a first channel of the plurality of channels at a block 1902. The digital value generated at the output of the analog-to-digital converter is provided to an arithmetic circuit at a block 1904. The arithmetic circuit could be the subtractor circuit 362 of FIGS. 3, 5 and 7, the multiplier circuit 1002 of FIGS. 10 and 12, or the subtractor 1506 of the skew control circuit of FIG. 15, for example. An average value representing a correction value associated with the digital value generated at the output of the analog-to-digital converter is provided to the arithmetic circuit at a block 1906. An average value could be generated at an output of an accumulator, as described above. The digital value is modified based upon the average value at a block 1908. The digital value could be modified to compensate for offset, gain, or skew mismatch, as also described above.

It can therefore be appreciated that new to circuits for and methods of compensating for mismatch between timer-interleaved analog-to-digital converters in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for compensating for mismatch in a plurality of channels of a time-interleaved analog-to-digital converter, each channel of the plurality of channels comprising:
   an analog-to-digital converter circuit configured to receive an analog input signal and to generate a digital value associated with the analog input signal;
   a subtractor circuit configured to receive the digital value generated at an output of the analog-to-digital converter circuit;
   a memory element configured to receive an output of the subtractor circuit; and
   an accumulator circuit coupled to the memory element, wherein the accumulator circuit generates, for a channel of the plurality of channels, an average value representing an offset voltage that is subtracted from the digital value generated at the output of the analog-to-digital converter circuit by the subtractor circuit; and
   wherein the subtractor circuit receives the average value representing the offset voltage for the channel.

2. The circuit of claim 1 further comprising for each channel a second accumulator circuit coupled between the memory element and the accumulator circuit, wherein the second accumulator circuit generates a second average value and wherein the accumulator circuit uses the second average value to generate the average value representing the offset voltage that is subtracted from the digital value by the subtractor circuit.

3. The circuit of claim 2 further comprising a residual offset calculator configured to receive the residual offset of each channel of the plurality of channels, wherein the residual offset calculator calculates an average of the residual offset of the plurality of channels that is subtracted for each channel from the digital value by the subtractor circuit.

4. The circuit of claim 1 further comprising for each channel a multiplier circuit configured to receive an output of the subtractor circuit, wherein the multiplier circuit enables controlling a gain of the digital signal generated at the output of the analog-to-digital converter circuit based upon an output of the accumulator circuit and a reference gain.

5. The circuit of claim 4 further comprising for each channel a divider circuit configured to receive the output of the accumulator circuit and the reference gain, wherein an output of the divider circuit comprises a gain control signal that is coupled to the multiplier circuit.

6. The circuit of claim 4 further comprising for each channel a skew control circuit configured to receive an output of the multiplier circuit and generate a skew value associated with the channel.

7. The circuit of claim 1 wherein each channel further comprises an adder circuit configured to receive the analog input signal and a channel offset, wherein the adder circuit models an input referred offset voltage of the channel.

8. The circuit of claim 1 further comprising an input adder circuit configured to receive the analog input signal and a modelled common offset voltage applied to each channel of the plurality of channels.

9. A circuit for compensating for mismatch in a plurality of channels of a time-interleaved analog-to-digital converter, each channel of the plurality of channels comprising:
   an analog-to-digital converter circuit configured to receive an analog input signal and to generate a digital value associated with the analog input signal;
   a multiplier circuit configured to receive the digital value generated by the analog-to-digital converter circuit;
   a memory element configured to receive an output of the multiplier circuit; and
   an accumulator circuit coupled to the memory element, wherein the multiplier circuit enables, for a channel of the plurality of channels, controlling a gain of the digital signal generated at the output of the analog-to-digital converter circuit using a gain control signal based upon an output of the accumulator circuit and a reference gain; and
   wherein the gain control signal comprises a scaled value, based upon the reference gain, for the channel.

10. The circuit of claim 9 further comprising for each channel an absolute value circuit coupled between the memory element and a divider circuit, where the absolute value circuit generates an absolute value of the output of the memory element.

11. The circuit of claim 9 further comprising for each channel a divider circuit configured to receive an output of the accumulator and the reference gain, wherein an output of the divider circuit comprises the gain control signal that is coupled to the multiplier circuit.

12. The circuit of claim 11 further comprising for each channel a selection circuit coupled to receive the output of the divider circuit, wherein the selection circuit enables a selection of the gain control signal or a unity gain value.

13. The circuit of claim 9 wherein the reference gain is calculated in a channel of the plurality of channels.

14. The circuit of claim 9 further comprising a skew control circuit configured to receive an output of the accumulator circuit of each channel and generate an average skew value associated with the plurality of channels.

15. A circuit for compensating for mismatch in a plurality of channels of a time-interleaved analog-to-digital converter, each channel of the plurality of channels comprising:
   an analog-to-digital converter circuit configured to receive an analog input signal and to generate a digital value associated with the analog input signal;
   a memory element configured to receive the digital value generated at an output of the analog-to-digital converter circuit;
   an accumulator circuit coupled to the memory element, wherein the accumulator circuit generates an average value representing a skew value that is used to generate a reference skew value; and
   a skew control circuit configured to receive an output of the accumulator circuit and the reference skew signal to compensate for skew of the channel with respect to a reference channel.

16. The circuit of claim 15 wherein the reference skew signal is an average of the skew values of the plurality of channels.

17. The circuit of claim 15 further comprising for each channel a subtractor circuit configured to receive the digital value generated at the output of the analog-to-digital converter circuit.

18. The circuit of claim 17 further comprising for each channel a second subtractor circuit configured to receive the skew value and the reference skew signal.

19. The circuit of claim 18 further comprising for each channel a second accumulator configured to receive an output of the second subtractor circuit and a hysteresis value, wherein the second accumulator generates a skew control output to control skew of the channel.

20. The circuit of claim 19 further comprising for each channel a skew control knob configured to receive the skew control output, where the skew control knob enables interleaving of the plurality of channels.

* * * * *